United States Patent [19]

Shimada

[11] 4,420,823
[45] Dec. 13, 1983

[54] SEMICONDUCTOR MEMORY
[75] Inventor: Hiroshi Shimada, Tokyo, Japan
[73] Assignee: Fujitsu Limited, Kawasaki, Japan
[21] Appl. No.: 219,949
[22] Filed: Dec. 24, 1980
[30] Foreign Application Priority Data
Dec. 25, 1979 [JP] Japan .................... 54-169067
[51] Int. Cl.³ .............................. G11C 7/02
[52] U.S. Cl. .................... 365/206; 307/542; 365/226
[58] Field of Search .............. 365/174, 189, 206, 207, 365/208, 226, 228, 103, 104; 307/520, 542
[56] References Cited

U.S. PATENT DOCUMENTS

| | | | |
|---|---|---|---|
| 3,189,877 | 6/1965 | Pricer et al. | 365/207 X |
| 3,978,459 | 8/1976 | Koo | 365/206 X |
| 4,085,458 | 4/1978 | Ikuzaki et al. | 365/206 |
| 4,223,394 | 9/1980 | Patlak et al. | 365/207 X |
| 4,336,465 | 6/1982 | Nakano et al. | 365/206 X |

*Primary Examiner*—Robert L. Richardson
*Attorney, Agent, or Firm*—Staas & Halsey

[57] ABSTRACT

A static semiconductor memory having a plurality of memory cells respectively connected to word lines and connected in parallel to bit line pairs and having a power-down function, is provided with a coupling noise canceller connected to a data bus which is connected at one end to a bit line via a transfer gate and at the other end to a sense amplifier. When the static semiconductor memory is placed in a power-down mode, the coupling noise canceller operates to clamp the data bus at a predetermined potential; thus preventing an increase in the access time when the chip is accessed from the power-down state rather than the active state.

11 Claims, 6 Drawing Figures

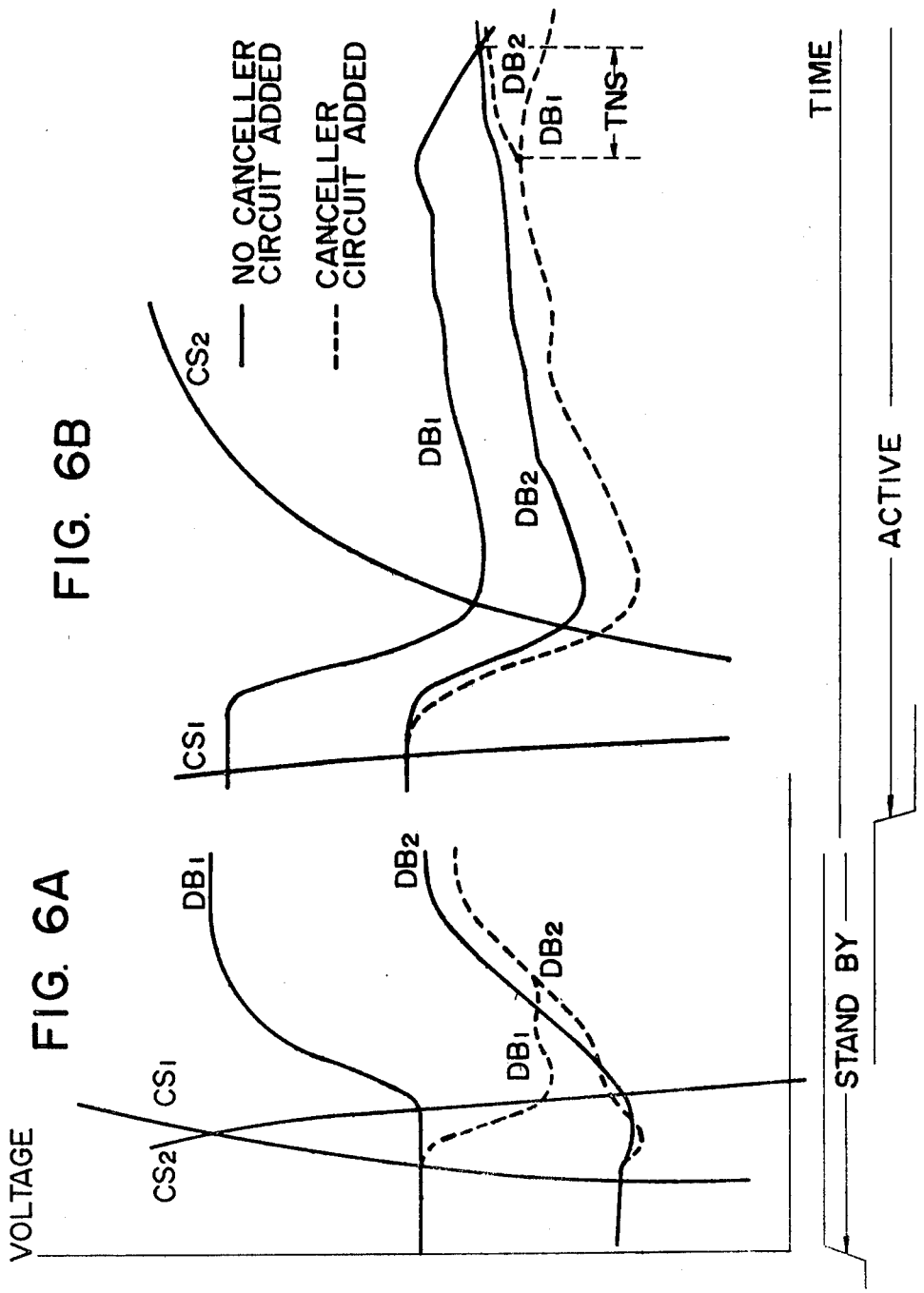

SEMICONDUCTOR MEMORY

BACKGROUND OF THE INVENTION

The present invention relates to a semiconductor memory, and more particularly, to a static memory provided with a bus line coupling noise canceller.

FIG. 1 is a block diagram of a known static RAM having a power-down mode. In FIG. 1, an external address input which is applied to a terminal 15 is provided to a row address buffer circuit 3 and its internal address output is supplied to a row decoder circuit 2, wherein it selects a row. In a similar manner, an external address input is applied to a terminal 16 and is then applied via a column address buffer circuit 4 to a column decoder circuit 5 for the selection of a column. External data input Din which is provided to a terminal 17, is applied to a data input circuit 7, by which valid data are written into selected cell. An external select input $\overline{CS}$ is provided to a terminal 18 and is then applied via a chip select circuit 8 to the row decoder circuit 2, the column address buffer circuit 4, the column decoder circuit 5 and a sense circuit 10 for controlling these circuits and to save power. An external write input is applied to a terminal 19 and is then provided via a write circuit 9 to the data input circuit 7 and an output circuit 11 to control those circuits. Further, the chip select circuit 8 controls the data input circuit 7 and the write circuit 9 at the same time.

A memory cell array comprises a static semiconductor having memory cells, each formed by a flip-flop, and respectively connected to intersections of pluralities of word lines and bit line pairs. FIG. 2 shows a part of the static semiconductor memory. In FIG. 2, reference characters $W_1$, $W_2$, ... indicate word lines; $B_{11}$ and $B_{12}$ designate a pair of bit lines; and $MC_{11}$, $MC_{12}$, ... identify memory cells respectively connected to the inter-sections of the word lines and the bit lines pairs. The pair of bit lines $B_{11}$ and $B_{12}$ is connected at one end to a power source Vcc respectively via transistors $Q_{11}$ and $Q_{12}$ serving as load transistors and at the other end to a sense amplifier SA respectively via transistors $Q_{13}$ and $Q_{14}$ forming transfer gates for column (bit line) selection use.

In a static memory having a power-down mode, a circuit for controlling the transfer gates $Q_{13}$ and $Q_{14}$ and the sense amplifier SA is arranged as shown in FIG. 3. In a column decoder, a NOR gate $NG_1$ for column selection use, a transistor $Q_{22}$ is turned ON and OFF by a signal $CS_2$ derived from a chip select signal, and is connected between a gate for receiving a column address input CAI and a load transistor $Q_{21}$. When a chip including the illustrated memory cell is not selected, the transistor $Q_{22}$ is held in the OFF state, preventing power consumption by the NOR gate $NG_1$. Also in the sense amplifier SA, a transistor $Q_{23}$ turned ON and OFF by the signal $CS_2$, is provided to prevent power consumption by the sense amplifier SA while the chip is not selected. Reference characters $DB_1$ and $DB_2$ indicate data buses, which are also connected to other bit line pairs via transfer gates similar to those $Q_{13}$ and $Q_{14}$ though not shown. Reference characters $Q_{24}$ and $Q_{25}$ designate transistors which are connected between the power source Vcc and the data buses to supply potentials to the data buses so that they do not become floating. Reference characters SD and SDB identify a pair of outputs or buses.

In this memory circuit, when the chip is being selected, the signal $CS_2$ is high-level and the transistor $Q_{22}$ is in the ON state. When the illustrated column of the memory is selected, the NOR gate $NG_1$ is turned OFF and when the column is not selected, the NOR gate $NG_1$ is in the ON state. When the NOR gate $NG_1$ is in the OFF state, the transistors $Q_{13}$ and $Q_{14}$ are turned ON by a high-level voltage of the power source Vcc applied thereto via the load transistor $Q_{21}$. As a consequence, the potentials of the bit lines $B_{11}$ and $B_{12}$ which become high- or low-level dependent on the stored content of a memory cell selected by the word line, are transmitted to the data buses $DB_1$ and $DB_2$, amplified by the sense amplifier SA and then outputted to the buses SD and SDB. If the illustrated column is not selected, then the NOR gate $NG_1$ is held in the ON state, so that transistors $Q_{13}$ and $Q_{14}$ have their gates grounded, thus disconnecting the bit lines $B_{11}$ and $B_{12}$ from the data buses $DB_1$ and $DB_2$. Since the transistors $Q_{13}$ and $Q_{14}$ are of the enhancement type (depletion type transistors being marked with a dot •), when they are in the ON state (their gate potentials being equal to the power source) the potentials of the bit lines $B_{11}$ and $B_{12}$ are lowered by a threshold voltage Vth of each of the transistors $Q_{11}$, $Q_{12}$ and $Q_{13}$, $Q_{14}$ and $Q_{24}$, $Q_{25}$ and data is transferred from the bit lines $B_{11}$ and $B_{12}$ to the data buses $DB_1$ and $DB_2$ at that lowered potential.

Now, let it be assumed that the chip including the illustrated memory cell, is placed in its nonselected, standby, state from the selected state. Between the gate and the source-drain path of each of the transistors $Q_{13}$ and $Q_{14}$ exists an electrostatic capacitance C due to an overlap. When the gate potentials of the transistors $Q_{13}$ and $Q_{14}$ are low-level, that is, when the chip is selected but the column is not selected, the capacitances C are charged up to the potentials of the data buses $DB_1$ and $DB_2$. In this state, when the chip becomes nonselected, standby the signal $CS_2$ becomes low-level and the transistor $Q_{22}$ is turned OFF, so that the gate potentials of the transistors $Q_{13}$ and $Q_{14}$ rise up to the voltage level of the power source Vcc. This not only turns ON the transistors $Q_{13}$ and $Q_{14}$ but also causes a bootstrap operation, by which the data buses $DB_1$ and $DB_2$ are charged by way of the power source, the transistor $Q_{21}$ and the charged capacitances C up to a level higher than the level (Vcc-Vth) which is lowered by the threshold voltage Vth of the transistors $Q_{13}$ and $Q_{14}$ from power source Vcc level. Since the prior art memory is not provided with a discharge circuit for this overcharging of the data buses, they remain in this ultra-high level state.

The overcharging of the data buses $DB_1$ and $DB_2$ also occurs in the sense amplifier SA, because there exist overlap capacitances C between the gates and the source-drain paths of transistors $Q_{26}$ and $Q_{27}$ of the sense amplifier SA. When the signal $CS_2$ is high-level and the transistor $Q_{23}$ is in the ON state, that is, when the sense amplifier SA is in operation, the capacitances C are charged by differences between the potentials of the data buses $DB_1$ and $DB_2$ and the potential at a node $N_2$, i.e. the connection point of the source of the transistors $Q_{26}$ and $Q_{27}$. When the chip becomes nonselected, the transistor $Q_{23}$ is turned OFF and the potential at the node $N_2$ is raised by load transistors $Q_{28}$ and $Q_{29}$ and the driven transistors $Q_{26}$ and $Q_{27}$ towards the power source potential and, by the stored charges of the capacitances C, the data buses $DB_1$ and $DB_2$ are overcharged.

If the potentials of the data are raised too high, there is the possibility that when the chip selection and the column selection are made, the sense amplifier SA reads first a difference between previous data which was selected during the previous cycle, resulting in time for an access in the chip select access mode lagging the access time for the chip select access mode where the buses are not stored charge by the above described coupling.

SUMMARY OF THE INVENTION

It is an object of the present invention to offer a solution to the above-mentioned problem encountered in the prior art static memory.

This object is accomplished by providing a coupling noise canceller which is connected to a data bus connected at the one end to a bit line via a transfer gate and at other end to a sense amplifier and which, when the bit line becomes nonselected, operates at clamp the data bus to a predetermined potential before the transfer gate and the sense amplifier are turned OFF.

BRIEF DESCRIPTION OF THE DRAWINGS

FIG. 6 is a potential distribution diagram illustrating the influence of coupling of a chip select signal on the data bus in the circuit shown in FIG. 3.

DESCRIPTION OF THE PREFERRED EMBODIMENTS

Figure 1:
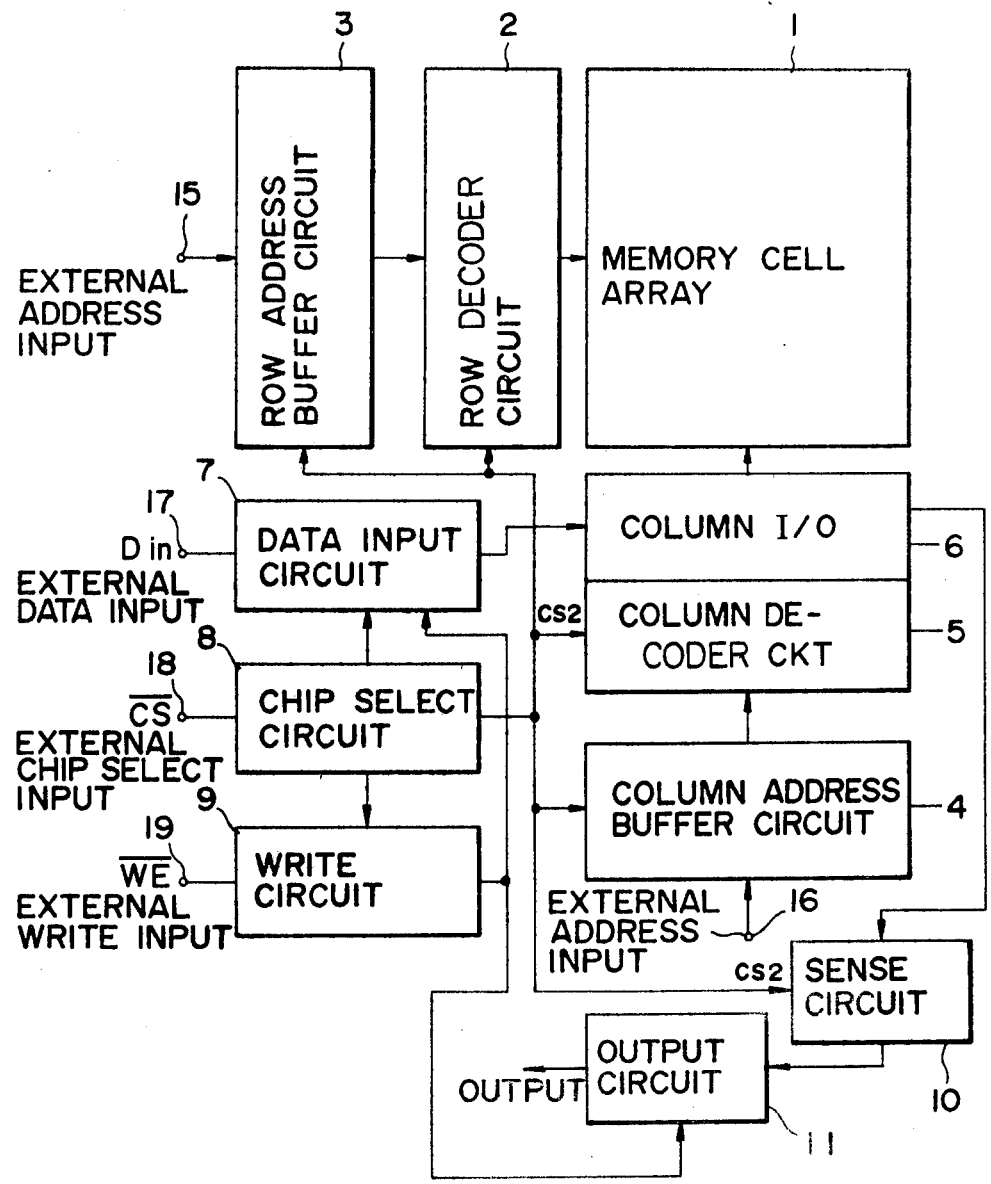
FIG. 1 is a block diagram of a conventional static RAM having a power-down mode.
Figure 2:
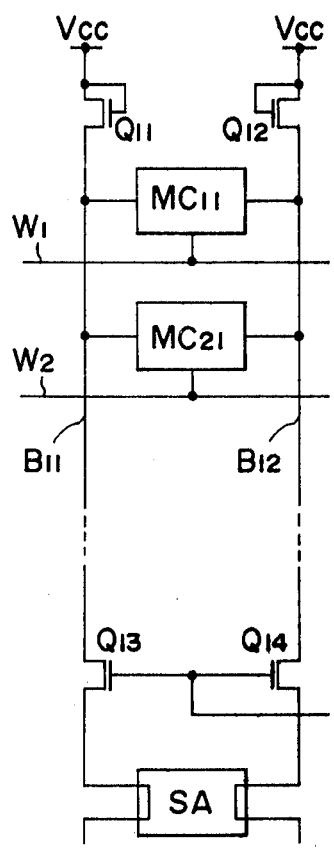
FIG. 2 is a circuit diagram illustrating a memory cell part of the memory shown in FIG. 1.
Figure 3:
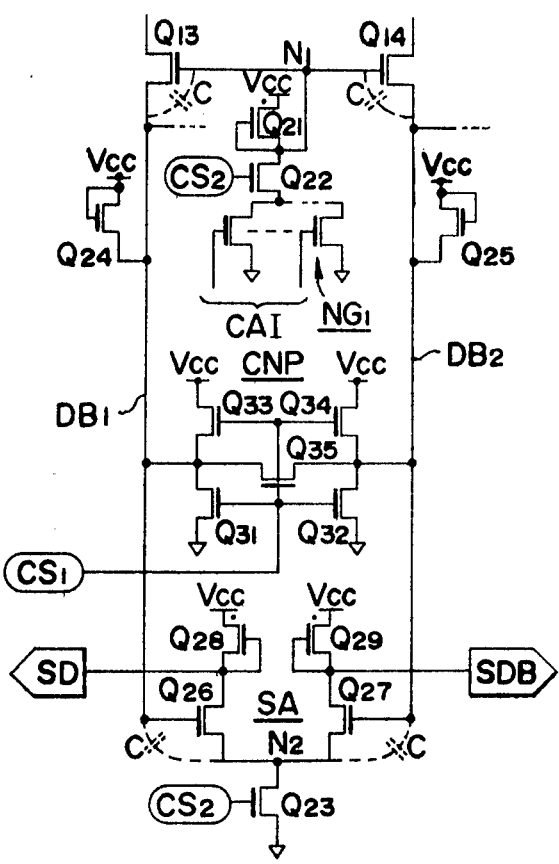
FIG. 3 is a circuit diagram of a data bus part illustrating an embodiment of the present invention.
Figure 4:
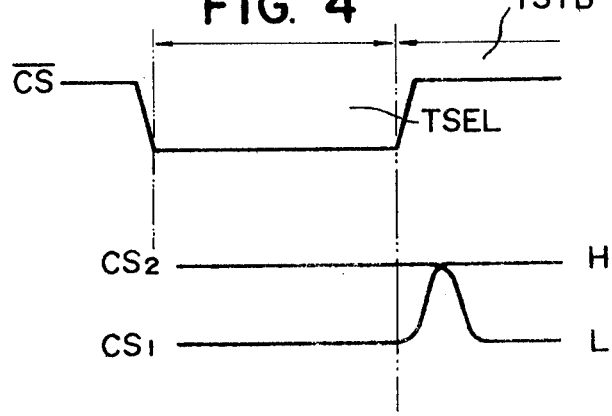
FIG. 4 is a schematic diagram of the timing for the signals of the FIG. 3 circuit.

FIG. 3 is a circuit arrangement part of a circuit related to reading signals out of a memory cell array. In FIG. 3, a circuit CNP constituted by transistors $Q_{31}$ to $Q_{35}$ is a coupling noise canceller for the data buses $DB_1$ and $DB_2$. The transistors $Q_{31}$ and $Q_{32}$ discharge the charges of the data buses $DB_1$ and $DB_2$ to ground and prevent an abnormal potential rise from occurring on the data busses. The transistor $Q_{35}$ short-circuits the data buses $DB_1$ and $DB_2$ to make them equipotential. These transistors are turned ON and OFF by the signal $CS_1$ which is derived from the chip select signal CS. FIG. 4 shows the phase relationships of the signals $\overline{CS}$, $CS_1$ and $CS_2$. When the signal $\overline{CS}$ is at the select period TSEL, the signal $CS_2$ is a high-level and the signal $CS_1$ is a low-level, holding the coupling noise canceller out of operation. When the signal $\overline{CS}$ is changed over to an nonselect, i.e. the standby period TSTB from the select period TSEL, the signal $CS_1$ rises to turn ON the transistors $Q_{31}$, $Q_{32}$ and $Q_{35}$, clamping the data buses $DB_1$ and $DB_2$ at a predetermined voltage. Thereafter, the signal $CS_2$ falls; as a result of this timing, the abnormal potential rise on the data buses can be inhibited. The transistors $Q_{33}$ and $Q_{34}$ divide the voltage of the power source $V_{cc}$, together with the transistors $Q_{31}$ and $Q_{32}$, thus functioning to hold the voltages of the data buses $DB_1$ and $DB_2$ during the standby period to the level Vcc-Vth.

A description will be given, with reference to FIG. 6, of the above-mentioned operating state.

In FIG. 3, when the memory is changed over to the standby state from the active state, the signal $CS_2$, which controls power-down and is applied to the decoder, the sense amplifier SA and so forth, becomes low-level, thus putting each buffer system (not shown) in a power-down mode. In the standby state, the potential at an output point $N_1$ of the column decoder rises up to the power source voltage Vcc and in the sense amplifier SA, too, the potential at the node $N_2$ assumes the high level which is determined by the sense amplifier SA. Accordingly, there occurs coupling between the transistor $Q_{13}$ and the data bus $DB_1$ and between the transistor $Q_{14}$ and the data bus $DB_2$ due to overlap. Also, in the sense amplifier SA, there occurs coupling due to the capacitances C indicated by the broken lines (see FIG. 3). As a result of this, the potential of each data bus rises higher than the load level which depends on the level, Vcc-Vth, and thus the charges stored are not discharged. This state is shown by the solid lines ($DB_1$, $DB_2$) in FIG. 6A. The bit line level is about (Vcc-Vth) but the bus line level rises higher than (Vcc-Vth) and the potential difference between the data buses when the memory becomes active (FIG. 6B) state remains unchanged. When the memory becomes active again (see FIG. 6B), the potential difference holds at its inactive level and then the bus line moves after time lag TNS, resulting in a lag in the access time.

Next, a description will be given of the case where the coupling noise canceller CNP of the present invention is provided. To the coupling noise canceller CNP is supplied the signal $CS_1$. When the memory is changed to the standby state, the signal $CS_1$ rapidly rises up to the power source voltage level Vcc to turn ON the coupling noise canceller CNP before the signal $CS_2$ becomes low-level and $Q_{22}$, $Q_{23}$ are cut off. At that moment, even if the signal $CS_2$ is low, thus causing coupling, charges due to this coupling are discharged via the transistors $Q_{31}$ and $Q_{32}$ to ground, thus providing a state in which no effective coupling is produced. The broken lines in FIGS. 6A and 6B show such an effect. When the signal $CS_1$ rises up, even if the signal $CS_2$ becomes low-level and $Q_{22}$, $Q_{23}$ are cut off, the bus line levels $DB_1$ and $DB_2$ stay equal as indicated by the broken lines.

Accordingly, in the case where the standby period is long, there does not occur the lag in the access time due to the coupling.

Figure 5:
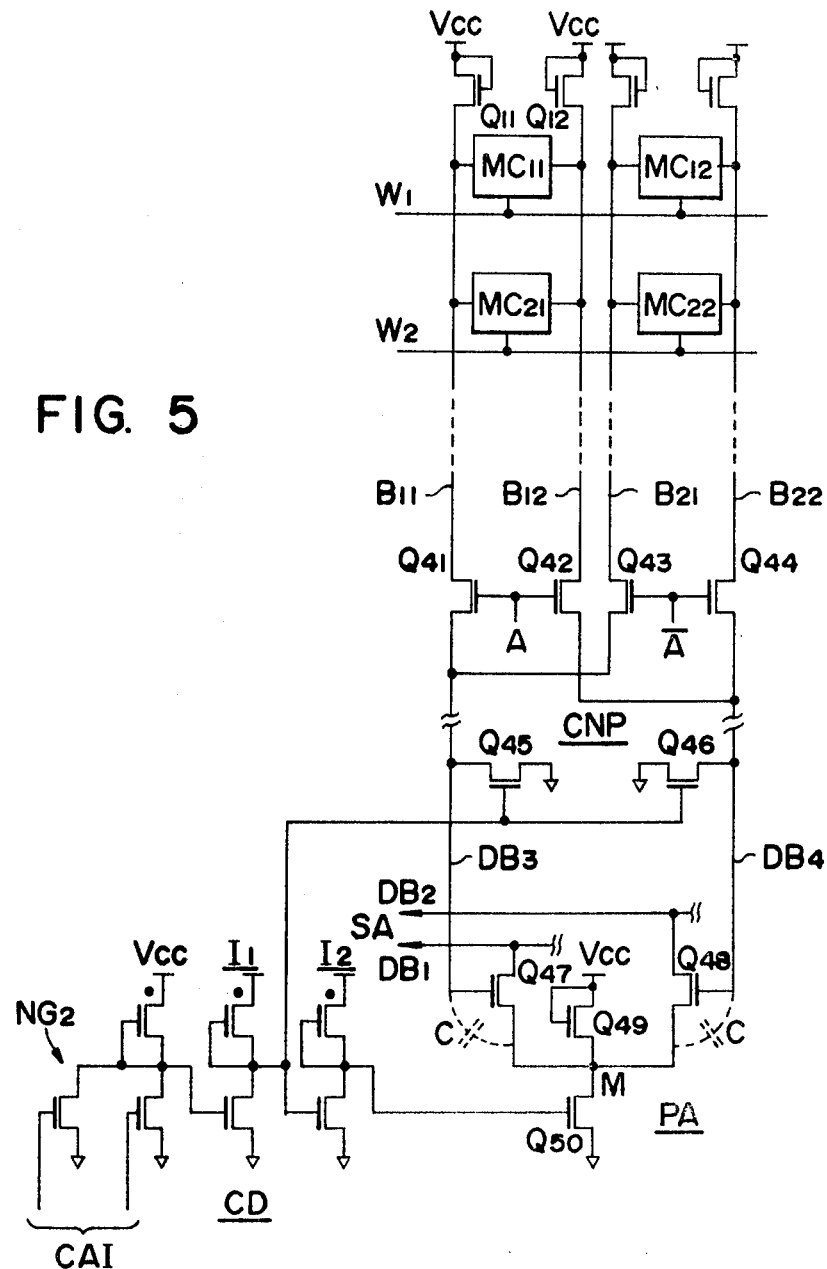
FIG. 5 is a circuit diagram of another embodiment of the present invention.

FIG. 5 illustrates another embodiment of the present invention. For this memory, two pairs of bit lines comprising a set of bit lines are shown together with a pre-amplifier PA for each set. Reference character CD indicates a column decoder. When the chip is selected, the output from a NOR gate $NG_2$ becomes high-level, the output from an inverter $I_1$ becomes low-level, the output from an inverter $I_2$ becomes high-level and a transistor $Q_{50}$ of the pre-amplifier PA is turned ON activating the preamplifier. In the pairs of bit lines $B_{11}$, $B_{12}$ and $B_{21}$, $B_{22}$ are respectively inserted pairs of transfer gates $Q_{41}$, $Q_{42}$ and $Q_{43}$, $Q_{44}$, which are turned ON and OFF by a least significant bit signal A of the column address input CAI and its inversion $\overline{A}$. For example, when the least significant bit signal A is high-level, the transfer gates $Q_{41}$ and $Q_{42}$ are turned ON to connect the pair of bit lines $B_{11}$ and $B_{12}$ to sub data buses $DB_3$ and $DB_4$, whereas when the least significant bit signal A is low-level, the transfer gates $Q_{43}$ and $Q_{44}$ are turned ON to connect the pair of bit lines $B_{21}$ and $B_{22}$ to the sub data buses $DB_3$ and $DB_4$.

In such a memory circuit, when the chip becomes nonselected, the transistor $Q_{50}$ is turned OFF and the potential at a node M is raised by a load transistor $Q_{49}$ up to the power source voltage level Vcc and, as a consequence, the capacitances C, between the gates and the source-drain paths of transistors $Q_{47}$ and $Q_{48}$ charged while the chip was selected, raise the potentials of the data buses $DB_1$ and $DB_2$. Transistors $Q_{45}$ and $Q_{46}$ inserted between the sub data buses $DB_3$ and $DB_4$ and the ground and the two inverters $I_1$ and $I_2$ provided at the output end of the column decoder CD inhibit this potential rise. That is, a control signal for the transistor $Q_{50}$ of the pre-amplifier PA may be derived directly from a NOR gate $NG_2$ of the column decoder CD, but two stages of inverters are inserted to provide a time delay and the transistors $Q_{45}$ and $Q_{46}$ are turned ON and OFF by the inverter of the first stage. With such an arrangement, when the chip is changed from the selected state to the nonselected state, the transistors $Q_{45}$ and $Q_{46}$ are turned ON first to hold the sub data buses $DB_3$ and $DB_4$ at voltages obtained by dividing the voltage of the power source Vcc by the transistors $Q_{11}$, $Q_{12}$ and $Q_{45}$, $Q_{46}$, respectively. Then the transistor $Q_{50}$ is turned off and, at this time, the potentials of the sub data buses tend to rise due to the charge stored by the charged capacitances C, but this rise in potential is prevented by discharging the stored charges to the ground via the transistors $Q_{45}$ and $Q_{46}$ which are already in the ON state when $Q_{50}$ is turned OFF.

As has been described in the foregoing, according to the present invention, there is provided a circuit which prevents the coupling noise due to the gate capacitances of transistors connected to data buses, that is, the overcharging of the data buses when the memory chip is changed from the selected state to the unselected state. This makes it possible to inhibit an increase in the access time (a time lag) when the memory chip is changed from the nonselected state to the selected state. Accordingly, the present invention is of great utility when put in practical use. Further, since the coupling noise canceller operates first when the memory chip is changed to the nonselected stated, the overcharging of the data buses is prevented; therefore, the coupling noise canceller is very effective in such a case where the chip selection and nonselection are repeated frequently.

It will be apparent that many modifications and variations may be effected without departing from the scope of the novel concepts of this invention.

What is claimed is:

1. A static semiconductor memory operatively connected to receive a first power supply voltage and a second power supply voltage lower than the first power supply voltage, and having a power-down mode, comprising:
    memory cells;
    word lines respectively, operatively connected to a corresponding one of said memory cells;
    bit line pairs respectively, operatively connected in parallel to a corresponding one of said memory cells;
    data bus pairs, each having a first and a second end and operatively connected in series to at least a respective one of said bit line pairs;
    sense amplifiers, each operatively connected to a respective one of said data bus pairs;
    transfer gates, each operatively connected in series between a respective one of said bit lines and a respective one of said data bus pairs;
    coupling noise cancellers each connected to a respective one of said data bus pairs and to receive said second supply voltage, said data bus pairs being connected at said first end to a respective one of said bit line pairs via a respective one of said transfer gates and the second end to a respective one of said sense amplifiers, for clamping the data bus pairs to a predetermined potential when the static semiconductor memory is switched to the power-down mode, and for discharging said data bus pairs to said second power supply voltage.

2. A static semiconductor memory according to claim 1, further comprising:
    column decoders, each operatively connected to a respective one of said bit line pairs and having a power down mode, for controlling said transfer gates associated with said respective bit line pair, wherein the coupling noise cancellers operate immediately before said column decoder enters said power-down mode.

3. A static semiconductor memory according to claim 1, wherein each of said sense amplifiers has a power-down mode, and the coupling noise cancellers operate immediately before the sense amplifier enters said power-down mode.

4. A static semiconductor memory according to claim 2, wherein each of said sense amplifiers has a power-down mode, and the coupling noise cancellers operate immediately before the sense amplifier enters said power-down mode.

5. A static semiconductor memory according to claim 2 or 4, wherein each of said column decoders comprises:
    a plurality of parallel connected transistors, each having a gate for receiving an input address signal, a source connected to ground and a drain operatively connected to a common point;
    a depletion type transistor having a gate operatively connected to a source, to said common point and to said respective transfer gates, and a drain operatively connected to said power supply voltage.

6. A static semiconductor memory according to claim 2, wherein said memory is operatively connected to receive a control signal, and each of said coupling noise controllers comprises:
    discharge means, operatively connected between said respective one of said data bus pairs and ground, for discharging charges stored on said respective data bus pair;
    load means, operatively connected between said power supply voltage and said respective one of said data bus pairs, for clamping said respective one of said data bus pairs at said predetermined potential;
    shorting means, operatively connected between said respective one of said data bus pairs, to said load means and to said discharge means, for equalizing the potentials of said respective one of said data bus pairs;
    control means operatively connected to said load means, to said discharge means, and to said shorting means, for receiving said control signal, and for operating said load means, said discharge means, and said shorting means in accordance with said control signal.

7. A static semiconductor memory according to claim 6, wherein said load means comprises first and second transistors, each having a drain operatively connected to receive said power supply voltage, a gate operatively connected to receive said control signal and a source, said discharge means comprises third and fourth transistors each having a source operatively connected to ground, a gate operatively connected to receive said control signal, and a drain operatively connected to a respective source of said first and second transistors, and wherein said shorting means comprises a fifth transistor having a drain and a source, each respectively, operatively connected to a respective one of said sources ofsaid first and second transistors, and to a respective one of said plurality of data bus pairs, and a gate operatively connected to receive said control signal.

8. A static semiconductor memory according to claim 2, 4, 6 or 7, further comprising preamplifiers respectively, operatively connected between respective ones of said data bus pairs and respective ones of said sense amplifiers.

9. A static semiconductor memory according to claim 8, wherein each of said column decoders further comprises means for controlling a respective one of said coupling noise cancellers and means for controlling a respective one of said preamplifiers.

10. A static semiconductor memory according to claim 9, wherein said memory is operatively connected to receive address signals, and wherein said means for controlling a respective one of said coupling noise cancellers comprises:

a NOR circuit having inputs operatively connected to receive said address signals, and an output;

a first inverter circuit having an input operatively connected to said output of said NOR circuit and an output operatively connected to said respective one of said coupling noise cancellers; and wherein said means for controlling a respective one of said preamplifiers comprises a second inverter circuit having an input operatively connected to said output of said first inverter circuit and an output operatively connected to said respective one of said of preamplifiers.

11. A static semiconductor memory according to claim 10, wherein each of said preamplifiers comprises:

a sixth transistor having a gate and drain operatively connected to receive said power supply voltage, and a source;

a seventh transistor operatively connected in series with said sixth transistor, having a drain operatively connected to said source of said sixth transistor at a junction point, and a gate operatively connected to said output of said second inverter circuit;

eighth and ninth transistors operatively connected between respective lines of a respective one of said data bus pairs and a respective one of said sense amplifiers, said eighth and ninth transistors each having a drain operatively connected to said respective one of said sense amplifiers and a source operatively connected to said junction point, and a gate operatively connected to said respective one of said data bus pairs.

* * * * *

UNITED STATES PATENT AND TRADEMARK OFFICE
CERTIFICATE OF CORRECTION

PATENT NO. : 4,420,823

DATED : December 13, 1983

INVENTOR(S) : Shimada

It is certified that error appears in the above-identified patent and that said Letters Patent is hereby corrected as shown below:

```
Column 1, line 19, after "into" insert --the--;
         line 39, "inter-sections" should be --intersections--
Column 3, line 5, delete "time for";
         line 6, "in" should be "time for--;
         line 20, "to" should be --at--;
         line 50, "CS" should be --C̄S̄--;
Column 4, line 14, "occurs" should be --is--.
Column 7, line 12, "ofsaid" should be --of said--.
```

Signed and Sealed this

Twelfth Day of June 1984

[SEAL]

Attest:

GERALD J. MOSSINGHOFF

Attesting Officer

Commissioner of Patents and Trademarks